(12) United States Patent
Kazinczi et al.

(10) Patent No.: US 8,237,913 B2
(45) Date of Patent: Aug. 7, 2012

(54) LITHOGRAPHIC APPARATUS AND METHOD

(75) Inventors: Robert Kazinczi, Helmond (NL); Wim Tjibbo Tel, Helmond (NL); Laurentius Cornelius De Winter, Vessem (NL)

(73) Assignee: ASML Netherlands B.V., Veldhoven (NL)

(\*) Notice: Subject to any disclaimer, the term of this patent is extended or adjusted under 35 U.S.C. 154(b) by 182 days.

(21) Appl. No.: 12/081,814

(22) Filed: Apr. 22, 2008

(65) Prior Publication Data

US 2008/0291412 A1 Nov. 27, 2008

Related U.S. Application Data

(63) Continuation-in-part of application No. 11/797,902, filed on May 8, 2007.

(51) Int. Cl.
*G03B 27/68* (2006.01)
*G03B 27/42* (2006.01)
*G03B 27/54* (2006.01)
*G03B 27/32* (2006.01)
*G03B 27/52* (2006.01)

(52) U.S. Cl. ............ 355/52; 355/30; 355/53; 355/55; 355/67; 355/77

(58) Field of Classification Search .......... 355/52, 355/55, 67–71, 77, 30, 40, 46, 53; 250/492.1, 250/492.2, 49.22
See application file for complete search history.

(56) References Cited

U.S. PATENT DOCUMENTS

| | | | |
|---|---|---|---|
| 6,031,946 A | 2/2000 | Bergmann et al. | |
| 6,078,380 A * | 6/2000 | Taniguchi et al. | ............ 355/52 |
| 6,248,486 B1 | 6/2001 | Dirksen et al. | |
| 6,272,392 B1 | 8/2001 | Capodieci | |
| 6,563,564 B2 | 5/2003 | De Mol et al. | |
| 6,658,084 B2 | 12/2003 | Singer | |
| 6,687,041 B1 * | 2/2004 | Sandstrom | .................. 359/291 |
| 6,737,662 B2 | 5/2004 | Mulder et al. | |
| 6,787,789 B2 | 9/2004 | Van Der Laan | |
| 6,871,337 B2 | 3/2005 | Socha | |
| 7,015,491 B2 * | 3/2006 | Eurlings et al. | ............. 250/548 |
| 7,016,017 B2 | 3/2006 | Hansen | |
| 7,034,919 B2 * | 4/2006 | Liebchen | ...................... 355/52 |

(Continued)

FOREIGN PATENT DOCUMENTS

JP 05-267124 A 10/1993

(Continued)

OTHER PUBLICATIONS

"ASML Deep-UV Wafer Stepper", Semiconductor Equipment Assessment, Results Bulletin No. 1 (Jan. 1998).
Wong, Alfred Kwok Kit, "Optical Imaging in Projection Microlithography", Tutorial Texts in Optical Engineering, vol. TT66, 2005, SPIE Press, Bellingham Washington USA, chapter 7.3, pp. 137-140.
Non-Final Rejection mailed Jun. 9, 2009 for U.S. Appl. No. 11/797,902, 15 pgs.

(Continued)

*Primary Examiner* — Peter B Kim
*Assistant Examiner* — Christina Riddle
(74) *Attorney, Agent, or Firm* — Sterne, Kessler, Goldstein & Fox P.L.L.C.

(57) ABSTRACT

A lithographic method is provided that includes using an illumination system to provide a beam of radiation having an illumination mode, using a patterning device to impart the radiation beam with a pattern in its cross-section, and projecting the patterned radiation beam onto a substrate. The illumination mode is adjusted after the radiation beam has been projected onto the substrate. The adjustment is arranged to reduce the effect of optical aberrations due to lens heating on the projected pattern during projection of the pattern onto a subsequent substrate.

16 Claims, 10 Drawing Sheets

U.S. PATENT DOCUMENTS

| | | | |
|---|---|---|---|
| 7,073,924 B2 | 7/2006 | Koizumi et al. | |
| 7,372,633 B2 * | 5/2008 | Uitterdijk et al. | 359/649 |
| 7,403,264 B2 | 7/2008 | Jeunink et al. | |
| 7,436,521 B2 * | 10/2008 | Emer et al. | 356/521 |
| 7,508,570 B1 * | 3/2009 | Meisburger | 359/290 |
| 7,532,308 B2 | 5/2009 | Bouman | |
| 2002/0001088 A1 | 1/2002 | Wegmann et al. | |
| 2002/0036758 A1 * | 3/2002 | de Mol et al. | 355/53 |
| 2004/0080737 A1 * | 4/2004 | Jasper et al. | 355/55 |
| 2004/0184030 A1 | 9/2004 | Liebchen | |
| 2004/0212793 A1 * | 10/2004 | Koizumi et al. | 355/67 |
| 2005/0210438 A1 * | 9/2005 | Verstappen et al. | 716/21 |
| 2005/0254024 A1 * | 11/2005 | Van Greevenbroek et al. | 355/30 |
| 2006/0008716 A1 | 1/2006 | Jeunink et al. | |
| 2006/0066841 A1 * | 3/2006 | Slonaker | 356/124 |
| 2006/0119838 A1 * | 6/2006 | Emer et al. | 356/124 |
| 2006/0132757 A1 * | 6/2006 | Sato | 356/124 |
| 2007/0013890 A1 | 1/2007 | Loopstra et al. | |
| 2008/0278698 A1 | 11/2008 | Kazinczi et al. | |

FOREIGN PATENT DOCUMENTS

| | | |
|---|---|---|
| JP | 05-304076 A | 11/1993 |
| JP | 05-315225 A | 11/1993 |
| JP | 06-029179 A | 2/1994 |
| JP | 07-273005 A | 10/1995 |
| JP | 2001-284222 A | 10/2001 |
| JP | 2002-015997 A | 1/2002 |
| JP | 2002-530878 A | 9/2002 |
| JP | 2002-334836 A | 11/2002 |
| JP | 2003-022967 A | 1/2003 |
| JP | 2003-158071 A | 5/2003 |
| JP | 2004-247737 A | 9/2004 |
| JP | 2006-024941 A | 1/2006 |
| JP | 2007-081397 A | 3/2007 |

OTHER PUBLICATIONS

English Language Abstract for JP 05-267124 A, published Oct. 15, 1993, 1 page.
English Language Abstract for JP 05-304076 A, published Nov. 16, 1993, 1 page.
English Language Abstract for JP 05-315225 A, published Nov. 26, 1993, 1 page.
English Language Abstract for JP 06-029179 A, published Feb. 4, 1994, 1 page.
English Language Abstract for JP 07-273005 A, published Oct. 20, 1995, 1 page.
English Language Abstract for JP 2001-284222 A, published Oct. 12, 2001, 1 page.
English Language Abstract for JP 2002-015997 A, published Jan. 18, 2002, 2 pages.
English Language Claims and Detailed Descriptions for JP 2002-530878 A, published Sep. 17, 2002, 2 pages.
English Language Abstract for JP 2002-334836 A, published Nov. 22, 2002, 1 page.
English Language Abstract for JP 2003-022967 A, published Jan. 24, 2003, 2 pages.
English Language Abstract for JP 2003-158071 A, published May 30, 2003, 1 page.
English Language Abstract for JP 2004-247737 A, published Sep. 2, 2004, 1 page.
English Language Abstract for JP 2006-024941 A, published Jan. 26, 2006, 2 pages.
English Language Abstract for JP 2007-081397 A, published Mar. 29, 2007, 1 page.
English translation of Notice of Reasons for Rejection directed to related Japanese Patent Application No. JP 2008-114085 A, mailed on Nov. 19, 2010 from the Japan Patent Office; 5 pages.

* cited by examiner

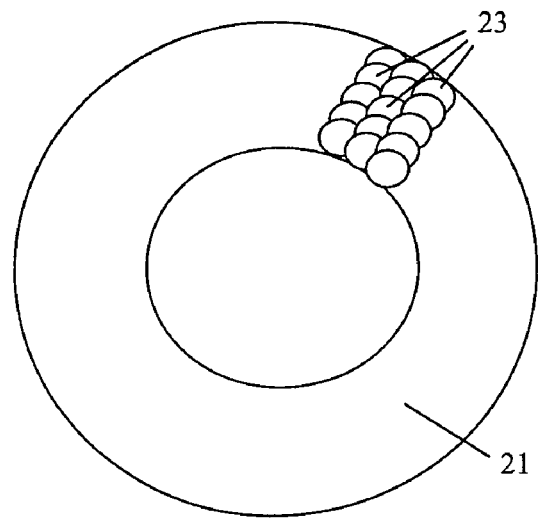
Figure 4
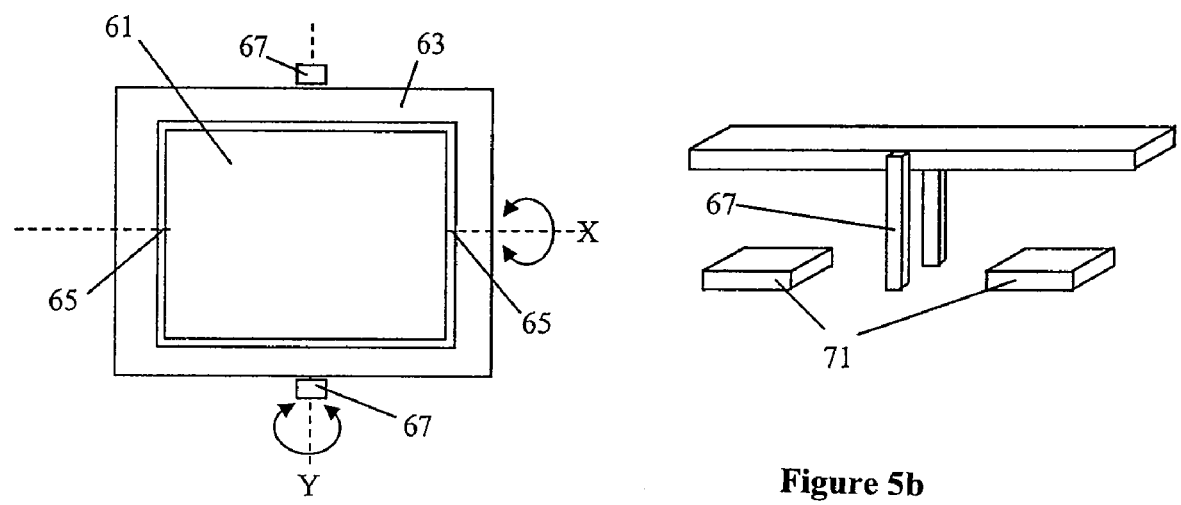
Figure 5b
Figure 5a

LITHOGRAPHIC APPARATUS AND METHOD

This application is a continuation-in-part application of U.S. patent application Ser. No. 11/797,902, filed May 8, 2007. The contents of the foregoing application is incorporated herein in its entirety by reference.

FIELD

The present invention relates to a lithographic apparatus and method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to impart a beam of radiation with a pattern in its cross-section, the pattern corresponding to circuit pattern of an individual layer of the IC. This pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing or projecting an image of the entire pattern onto the target portion at one time, and so-called scanners, in which each target portion is irradiated by scanning the pattern through the beam in a given direction (the "scanning"-direction) while synchronously scanning the substrate parallel or anti-parallel to this direction.

A lithographic printing process typically includes pre-exposure processes applied to the substrate prior to the imaging step, such as priming, resist coating and a soft baking of the substrate. After the imaging step, the substrate may be subjected to other procedures, such as a post-exposure bake (PEB), development, a hard bake and measurement/inspection of the imaged features. This array of procedures is used as a basis to provide printed features constituting a pattern of an individual layer of a device, e.g. an IC. Such a patterned layer may then undergo various processes such as etching, ion-implantation (doping), metallization, oxidation, chemo-mechanical polishing, all intended to finish off an individual layer.

Typically, the aforementioned imaging or projection of the pattern onto the substrate is performed by having the patterned beam of radiation traverse a projection system. The projection system may comprise a series of lenses, and is arranged to project the pattern with high precision, i.e. introducing only small amounts of distortion or other errors into the projected pattern. In conventional operation of a lithographic apparatus, a multiplicity of substrates are patterned in series, one after another. Over time the projection system will heat up, due to absorption of the radiation which passes through it during projection of the pattern. This heating causes the shapes of the lenses and/or other optical elements of the projection system to change, thereby causing optical aberrations to occur which distort the pattern projected onto the substrate, or which or otherwise affect the fidelity of the pattern imaged on the substrate. Consequently, the pattern fidelity of imaged, as well as of printed, features may be affected over time, due to such heating.

The optical aberrations may be corrected by using actuators to adjust, for example, a shape of one or more of the lenses. However, this correction only works to a limited extent. There is a tendency in lithography towards using illumination modes in which radiation is increasingly concentrated over smaller areas during projection by the projection system. A lithographic apparatus generally comprises an illumination system which receives radiation from a source, such as a laser or an EUV radiation source, and produces the aforementioned beam of radiation for illuminating the patterning device. Within a typical illumination system, the beam is shaped and controlled such that at a pupil plane of the illumination system the beam has a desired spatial intensity distribution. The spatial intensity distribution at the pupil plane effectively acts as a virtual radiation source for providing illumination radiation at patterning device level. Any specific shape of the intensity distribution may be referred to as an illumination mode. Illumination modes used for printing patterns are, for example, "conventional illumination" (a top-hat disc-shaped intensity distribution in the pupil), and "off-axis" illumination modes such as annular, dipole, quadrupole and more complex shaped arrangements of the illumination pupil intensity distribution. The above mentioned tendency concerns in particular with off-axis illumination modes, wherein radiation impinging on the patterning device at an off-axis direction is increasingly concentrated over smaller areas in the pupil of the illumination system and the projection system during substrate exposure. This concentration of the radiation increases the extent to which optical elements of the projection system are heated or locally heated by the radiation. This in turn increases a distortion or blurring of the projected image and may decrease the fidelity or quality of the printed pattern beyond tolerance.

SUMMARY

It is desirable to provide a lithographic apparatus and method which reduces or mitigates one or more of the above mentioned problems.

According to an aspect of the invention, there is provided a lithographic method comprising: using an illumination system to provide a beam of radiation having an illumination mode; imparting the beam of radiation with a pattern in its cross-section; projecting the pattern onto a substrate using a projection system; adjusting the illumination mode after projecting the pattern onto the substrate, the adjusting including reducing an effect of an optical aberration on the projected pattern due to lens heating during projection of the pattern onto a subsequent substrate; and subsequent to the adjusting, projecting the pattern onto the subsequent substrate.

According to a further aspect of the invention there is provided a lithographic method comprising: using an illumination system to provide a beam of radiation having an illumination mode; imparting the beam of radiation with a pattern in its cross-section; projecting the pattern onto a target portion on a substrate using a projection system; adjusting the illumination mode after projecting the pattern onto the target portion, the adjusting including reducing an effect of an optical aberration on the projected pattern due to lens heating during projection of the pattern onto a subsequent target portion on the substrate; and subsequent to the adjusting, projecting the pattern onto the subsequent target portion.

According to a further aspect of the invention there is provided a lithographic apparatus comprising: an illumination system configured to provide a beam of radiation with an illumination mode; a support structure configured to hold a patterning device, the patterning device serving to impart the beam with a pattern in its cross-section; a substrate table configured to hold a substrate; a projection system configured to project the patterned radiation beam onto a target portion of the substrate; and a controller arranged to control part of the illumination system, the controller being arranged to adjust the illumination mode of the beam after the beam has been projected onto a substrate or a target portion on a single substrate, the adjustment being arranged to reduce an effect of optical aberration on the pattern due to lens heating during projection of the pattern onto a subsequent substrate or a subsequent target portion on the single substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a spatial intensity distribution in a pupil plane;

FIGS. 5a and 5b are top and perspective views, respectively, which schematically illustrate a mirror of a mirror array which may form part of the lithographic apparatus shown in FIG. 1;

DETAILED DESCRIPTION

Figure 1:
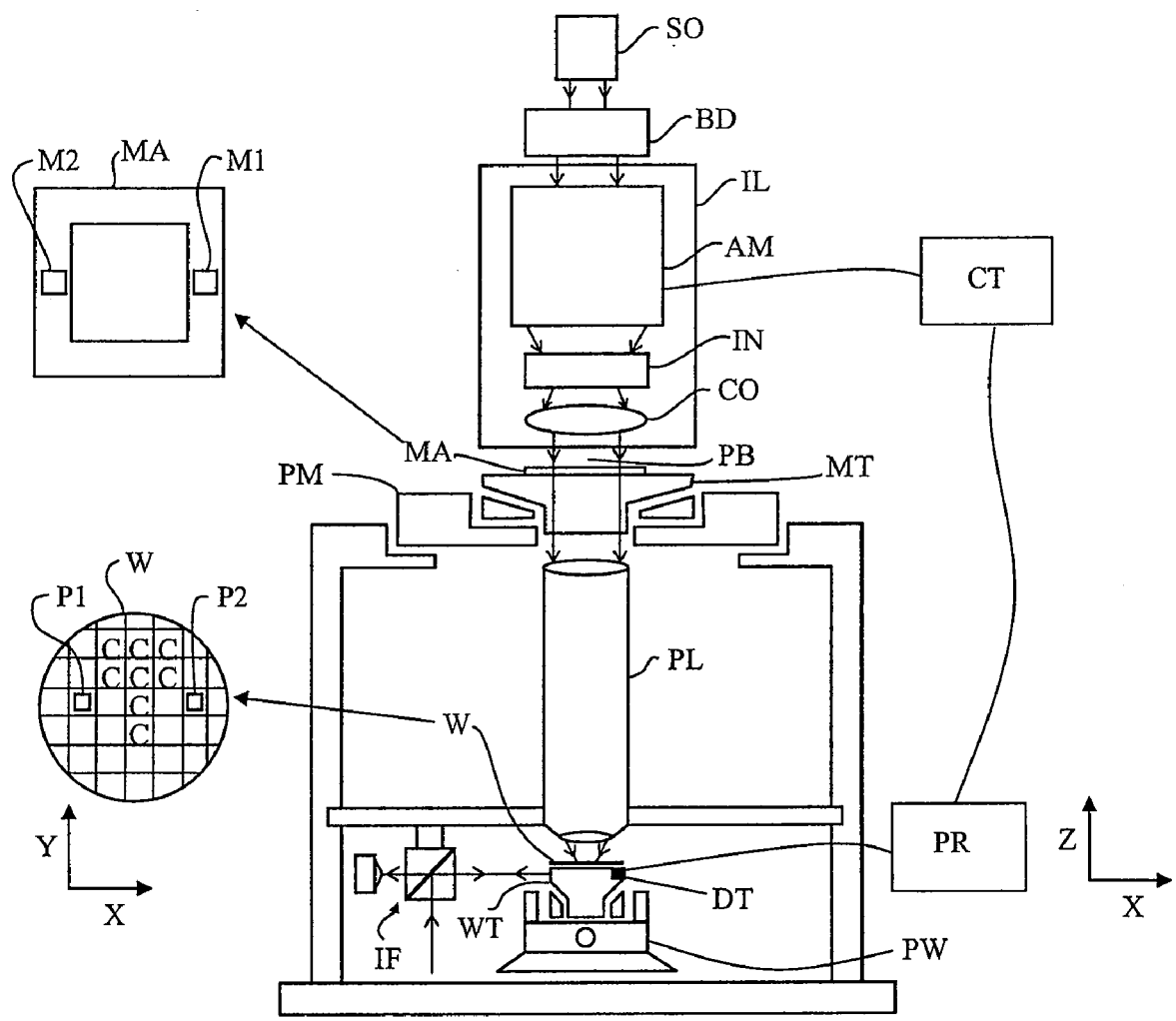
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system and projection system may encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual-stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may be of a type which allows rapid switching between two or more masks (or between patterns provided on a controllable patterning device), for example as described in U.S. Patent Application Publication No. 2007-0013890A1.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 schematically depicts a lithographic apparatus according to a particular embodiment of the invention. The apparatus comprises:

- an illumination system (illuminator) IL to condition a radiation beam PB of radiation (e.g. UV radiation or EUV radiation);
- a support structure (e.g. a support structure) MT to support a patterning device (e.g. a mask) MA and connected to first positioning device PM to accurately position the patterning device MA with respect to item PL;
- a substrate table (e.g. a wafer table) WT for holding a substrate (e.g. a resist-coated wafer) W and connected to a second positioning device PW to accurately position the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The support structure MT holds the patterning device. It holds the patterning device in a way depending on the orientation of the patterning device, the design of the lithographic apparatus, and other conditions, such as for example whether or not the patterning device is held in a vacuum environment. The support structure MT can use mechanical clamping, vacuum, or other clamping techniques, for example electrostatic clamping under vacuum conditions. The support structure MT may be a frame or a table, for example, which may be fixed or movable as required and which may ensure that the patterning device is at a desired position, for example with respect to the projection system.

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam B is passed from the source SO to the illuminator IL with the aid of a beam delivery system BD comprising for example suitable directing mirrors and/or a beam expander. In other cases, the source SO may be an integral part of the apparatus, for example when the source SO is a mercury lamp. The source SO and the illuminator IL, together with the beam delivery system BD if required, may be referred to as a radiation system.

The illuminator IL is described further below.

Upon leaving the illuminator IL, the radiation beam PB is incident on the patterning device (e.g. mask) MA, which is held on the support structure MT. Having traversed the patterning device MA, the radiation beam PB passes through the projection system PL, which focuses the beam PB onto a target portion C of the substrate W. With the aid of the second positioning device PW and position sensor IF (e.g. an interferometric device), the substrate table WT can be moved accurately, e.g. so as to position different target portions C in the path of the radiation beam PB. Similarly, the first positioning device PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following exemplary modes:

1. In step mode, the support structure MT and the substrate table WT are kept essentially stationary, while an entire pattern imparted to the radiation beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

The illuminator IL may comprise adjuster AM configured to adjust the angular intensity distribution of the radiation beam PB. This may allow adjustment of for example, the outer and/or inner radial extent (commonly referred to as σ-outer and σ-inner, respectively) of the intensity distribution in a pupil plane of the illuminator IL. In addition, the illuminator IL generally comprises various other components, such as an integrator IN and coupling optics CO. The integrator, which may for example be a quartz rod, improves the homogeneity of the radiation beam PB.

The spatial intensity distribution of the radiation beam PB at the illuminator pupil plane is converted to an angular intensity distribution before the radiation beam PB is incident upon the patterning device (e.g. mask) MA. In other words, there is a Fourier relationship between the pupil plane of the illuminator IL and the patterning device MA (the patterning device is in a field plane). This is because the illuminator pupil plane substantially coincides with the front focal plane of the coupling optics CO, which focus the radiation beam PB to the patterning device MA.

Selection of an appropriate spatial intensity distribution at the pupil plane can be used to improve the accuracy with which an image of the patterning device MA is projected onto a substrate W. In particular, spatial intensity distributions with dipole, annular or quadrupole off-axis illumination profiles may be used to enhance the resolution with which the pattern is projected, or to improve other parameters such as sensitivity to projection system optical aberrations, exposure latitude and depth of focus.

A detector DT is provided in the substrate table WT, and is arranged to measure aberrations present in the radiation beam PB. The detector DT is connected via a processor PR to a controller CT. The controller CT is arranged to adjust settings of the illuminator IL in response to signals received from the measurement system. The manner in which this is done is described further below in relation to FIG. 6.

Figure 2:
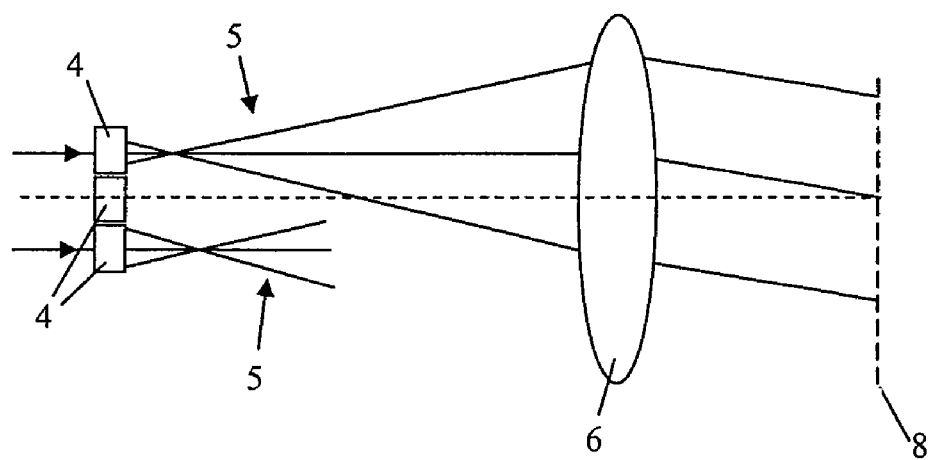
FIG. 2 schematically illustrates the transformation of an angular intensity distribution to a spatial intensity distribution.

FIG. 2 schematically illustrates the principle of corresponding angular and spatial intensity distributions of a radiation beam PB. For example, the outer and/or inner radial extent of the radiation beam (σ-outer and σ-inner respectively) may be set using an array of diffractive elements 4. Each diffractive element 4 forms a divergent pencil 5 of rays. Each pencil 5 of rays corresponds to a part or sub-beam of the radiation beam PB. The pencils 5 will be incident at a focusing lens 6. In the back focal plane 8 of the focusing lens 6, each pencil 5 corresponds to an illuminated area. The size of the area depends on the range of directions into which the rays of the pencil 5 propagate. If the range of directions is small, the size of the illuminated area in the back focal plane 8 is also small. If the range of directions is large, the size of the illuminated area in the back focal plane 8 is also large. Furthermore, all identical directions of the pencils 5, i.e. all rays which are parallel to each other, correspond to the same particular point in the back focal plane 8 (provided that ideal optical conditions apply).

It is known to produce a spatial intensity distribution in a cross-section of the radiation beam PB (in particular in a pupil plane of the radiation beam PB) which has an annular shape. This is known as an annular illumination mode. An example of this annular shape is illustrated in FIG. 4 by two concentric circles. The inner radial extent (σ-inner) of the annular shape corresponds to the central area with an intensity of zero or close to zero, and can be set by using an appropriate array of diffractive optical elements. For example, referring to FIG. 2 an array of diffractive elements 4 can be selected which is configured such that none of the pencils 5 of rays will be incident at the central area, and will instead only be incident in the annular area (although in practice, there may be an intensity greater than zero in the central area, due to effects such as dispersion). By appropriate selection of the diffractive element array 4, other spatial intensity distributions can be produced in the cross-sectional area, such as dipole or quadrupole illumination. Additional optical elements (not illustrated) such as a zoom lens or an axicon may be used to apply further modifications to the angular distribution of the radiation beam PB.

Figure 3:
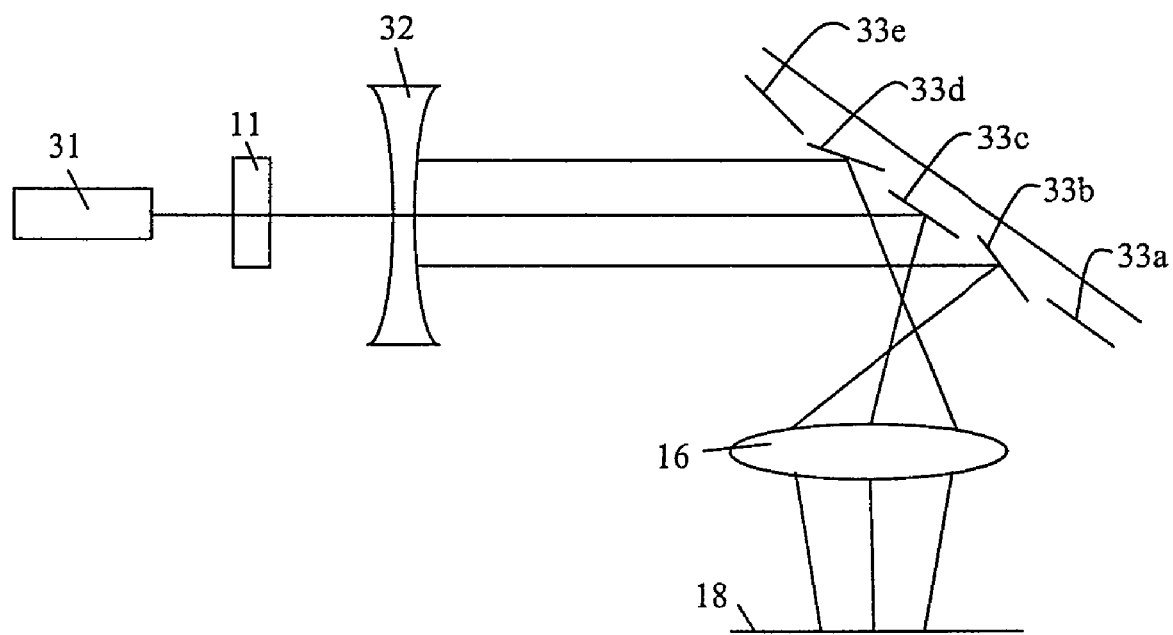
FIG. 3 schematically illustrates in more detail part of the lithographic apparatus shown in FIG. 1.

FIG. 3 schematically shows a further arrangement. A source 31 (equivalent to SO in FIG. 1) outputs a relatively narrow, collimated radiation beam which passes through a shutter 11. It is then passed through beam divergence optics 32 which expand the beam to a size which corresponds to the size of an array 33 of reflective elements 33a, 33b, 33c, 33d, 33e. Ideally, the radiation beam divergence optics 32 should output a collimated beam. In an embodiment, the size of the expanded radiation beam is sufficient that the radiation beam is incident at all reflective elements 33a to 33e. In FIG. 3, by way of example, three sub-beams of the expanded radiation beam are shown.

A first sub-beam is incident at reflective element 33b. Like the other reflective elements 33a and 33c to 33e of the array 33, the reflective element 33b can be controlled to adjust its orientation so that the sub-beam is reflected in a desired direction. Redirecting optics 16, which may comprise a focusing lens, redirect the sub-beam so that it is incident at a desired point or small area in a cross-sectional plane 18 of the radiation beam. The cross-sectional plane 18 may coincide with a pupil plane, which acts as a virtual radiation source for other parts of the illuminator (not shown in FIG. 3). The other sub-beams shown in FIG. 3 are reflected by the reflective elements 33c, 33d and redirected by redirecting optics 16 so as to be incident at other points of plane 18. By controlling the orientations of the reflective elements 33a to 33e, almost any spatial intensity distribution in the cross-sectional plane 18 can be produced.

Although FIG. 3 shows only five reflective elements 33a-e, the array 33 may comprise many more reflective elements, for example arranged in a two-dimensional grid. For example, the array 33 may comprise 1024 (e.g. 32×32) mirrors, or 4096 (e.g. 64×64) mirrors, or any other suitable number of mirrors. More than one array of mirrors may be used. For example a group of four mirror arrays having 32×32 mirrors may be used. In the following text, the term 'array' may mean a single array or a group of mirror arrays.

FIG. 4 shows a spatial intensity distribution in a pupil plane which may be produced by the illuminator IL of the lithographic apparatus. FIG. 4 may be understood as a schematic diagram which illustrates the principle of producing a spatial intensity distribution using a plurality of sub-beams. The drawing plane of FIG. 4 coincides with a cross-section of the radiation beam PB, for example, the cross-sectional plane 18 of FIG. 3. FIG. 4 depicts fifteen circular areas 23 which represent areas with an illumination intensity greater than a threshold value. The intensity distribution shown in FIG. 4 has approximately the shape of a parallelogram. Since the sub-beams of the radiation beam PB can be directed to any desired place of the cross-sectional area, almost any intensity profile can be produced. However, it is also possible to produce what could be considered to be conventional intensity distributions, e.g. with an annular shape, with a dipole shape, or with a quadrupole shape. In FIG. 4, the area 21 in between the inner and outer circles can be filled with circular areas 23. The σ-outer and σ-inner can be adjusted by directing the sub-beams to the corresponding places between the inner circle and the outer circle.

FIGS. 5a and 5b show schematically an example of a reflective element, which may for example form part of the array 33 of reflective elements shown schematically in FIG. 3. The array of reflective elements may comprise for example more than 1000 of such reflective elements, which may for example be arranged in a grid-like formation in a plane which crosses through a radiation beam. The reflective element is viewed from above in FIG. 5a and in a perspective view in FIG. 5b. For ease of illustration some of the detail shown in FIG. 5a is not included in FIG. 5b. The reflective element comprises a mirror 61 with a rectangular reflective surface area. In general, the mirror 61 can have any desired shape, for example square, rectangular, circular, hexagonal, etc. The mirror 61 is connected to a support member 63 via a rotational connection 65. The mirror 61 may be rotated with respect to the support member 63, the rotation being around a first axis X (indicated by a dashed line). The support member 63 is rotationally connected to legs 67 which are supported by a substrate (not shown). The support member 63 may be rotated around a second axis Y (indicated by a dashed line). It is therefore possible to orientate the mirror 61 in directions which require a combination of X-axis and Y-axis rotations.

The orientation of the mirror 61 may be controlled using electrostatic actuators 71. The electrostatic actuators 71 comprise plates to which charges are applied. The charges attract the mirror 61 via electrostatic attraction, and are varied to adjust the orientation of the mirror 61. Sensors may be provided to give feedback control of the orientation of the mirror 61. The sensors may for example be optical sensors, or may for example be capacitive feedback sensors. The plates which are used as electrostatic actuators may also act as the capacitive feedback sensors. Although only two electrostatic actuators 71 are shown in FIG. 5b, more than two may be used. Any other suitable form of actuator may be used. For example piezo-electric actuators may be used.

The orientation of the mirror 61 can be adjusted so as to reflect an incident radiation beam into any desired direction of a hemisphere. Further details concerning reflective elements of the type shown in FIGS. 5a and 5b, and of other types, are disclosed in for example U.S. Pat. No. 6,031,946.

Figure 6:
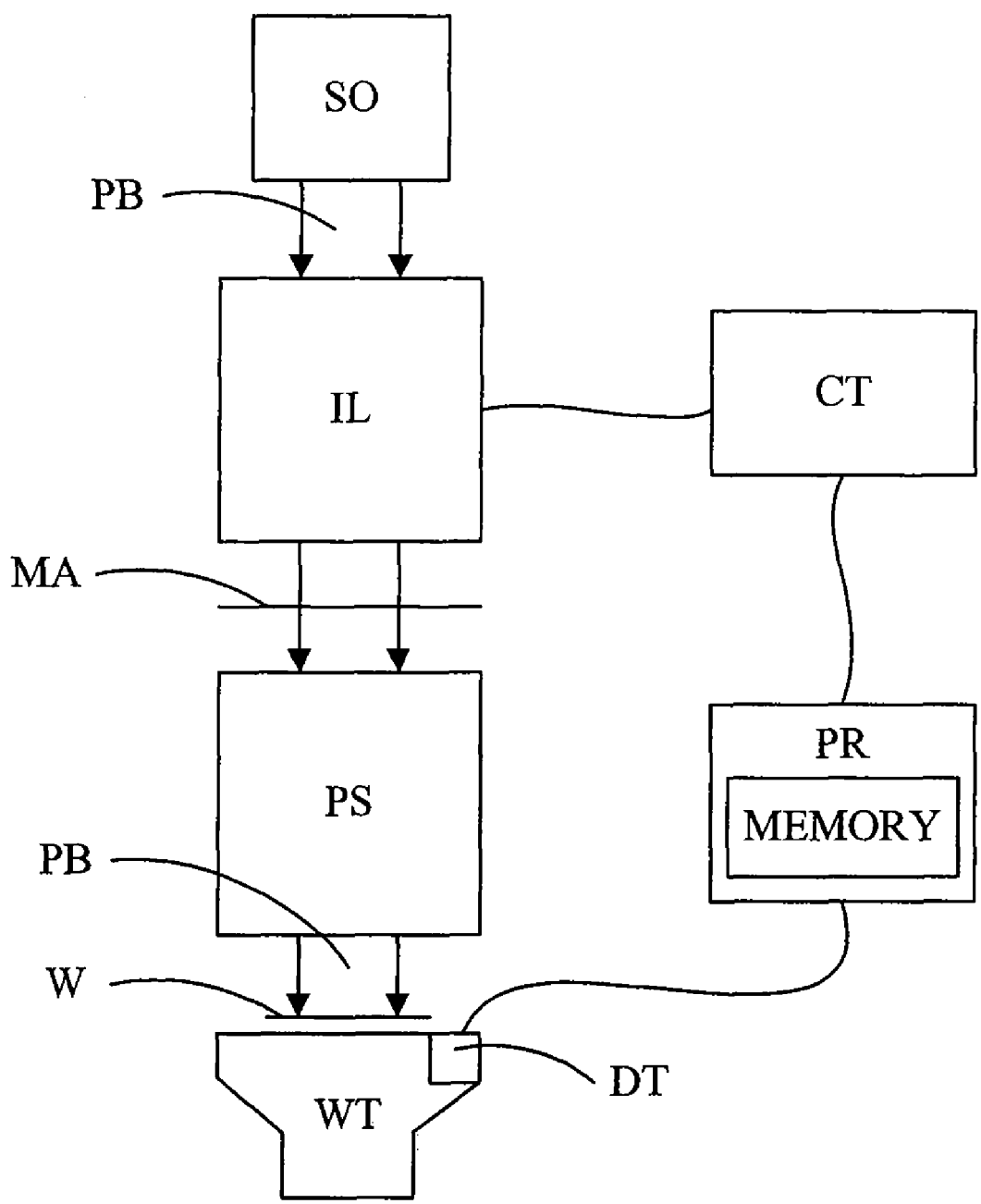
FIG. 6 schematically depicts elements of the lithographic apparatus shown in FIG. 1 which are of relevance to an embodiment of the invention.

FIG. 6 is a simplification of FIG. 1, and shows some elements of the lithographic apparatus which are of relevance to an embodiment of the invention. As described further above, the source SO may for example comprise a laser arranged to direct a radiation beam PB to the illuminator IL. The illuminator IL may include an array of mirrors which are arranged to provide a required illumination mode in the manner described above. The illuminator IL is arranged to direct radiation with a desired mode onto the patterning device MA, which applies a pattern onto the radiation beam PB. The projection system PL, which may comprise a set of refractive lenses, is arranged to project the pattern onto a substrate W supported on a substrate table WT.

The detector DT is arranged to measure aberrations in the radiation beam. Aberrations refer to optical aberrations imparted by the projection system PL to the radiation beam traversing the projection system PL, and may be represented as image aberrations present in an image or, equivalently, as wave front aberrations of a wave front present in the radiation beam. The detector DT is connected via the processor PR to the controller CT. The controller CT controls the orientation of the mirror array provided within the illuminator IL.

In use, the lithographic apparatus is arranged to project a pattern onto a multiplicity of substrates in series. During projection of the pattern onto the substrates, the majority of radiation will pass through the projection system PL and be incident upon the substrate W. However, a small proportion of the radiation will be absorbed by optical elements, such as lenses, within the projection system PL, causing the optical elements to heat up. This is a known effect, and is often referred to generally as lens heating. Herein references to lens heating shall mean the more general heating of one or more optical elements, such as lenses. The rate at which the optical elements get hotter decreases over time, until eventually the temperature of the optical elements stabilizes (this is sometimes referred to as saturation). In a typical transmissive lithographic apparatus the temperature of the lenses may stabilize after for example 15 minutes (the time period is different for different apparatus). Stabilization of the temperature occurs once the optical elements dissipate the heat provided by the radiation beam at a rate which is the same as the rate at which heat is added to the optical elements by the radiation beam. Heating of the optical elements may cause optical aberrations affecting a pattern being projected onto the substrate table WT. The detector DT provided in the substrate table is arranged to detect or measure these aberrations and to measure changes in aberrations with time. The detector DT may for example be constructed and arranged as part of a shearing interferometer system. The shearing interferometer may be included in the lithographic apparatus. Details of a shearing interferometer system for an in-situ aberration measurement of projection system aberrations can be gleaned from United States Application Publication No. US 2002/0001088. A shearing interferometer which is part of the lithographic apparatus typically comprises a source module and the detector DT. The source module has a patterned layer of chromium that is placed in an object plane of the projection system PL (the plane of the patterning device pattern) and has additional optics provided above the chromium layer. The combination provides a wave front of radiation to the entire pupil of the projection system PL. The detector DT in this embodiment includes a patterned layer of chromium (lens interferometer marker) that is placed in the image plane of the projection system PL and a camera that is placed some distance behind that layer of chromium. The patterned layer of chromium on the detector diffracts radiation into several diffraction orders that interfere with each other giving rise to a interferogram. The interferogram is measured by the camera. The aberrations of the projection system PL can be determined by software based upon the measured interferogram. Alternatively, the detector DT may be constructed and arranged as a transmission image sensor, and may be used to measure at substrate level a position of a projected aerial image of a mark pattern at patterning device (mask) level. The projected image at substrate level may be a line pattern with a line width comparable to the wavelength of the exposure radiation. The transmission image sensor measures the aforementioned mark pattern using a transmission pattern with a photocell underneath it. The sensor may be used to measure optical performance of the projection system. By using different illumination settings in combination with different projected images, aberrations such as coma, spherical aberration, astigmatism and field curvature can be measured. A detailed description of a corresponding measurement method can be gleaned from U.S. Pat. No. 6,787,789. In any of the embodiments described above, the detector DT may be moved transverse to the radiation beam PB in order to allow one or more aberrations present in different parts of the radiation beam to be measured. This may be achieved by moving the substrate table WT upon which the substrate W is located. Aberration data representative of a wave aberration $Wa(\rho, \theta)$, expressing an aberration as a wave-phase error (i.e., as a fraction of wavelength $\lambda$), are conventionally written in terms of orthonormal Zernike circle polynomials $f_j(\sigma, \theta)$ and corresponding Zernike aberration coefficients $Z_j$ weighting the presence of the respective Zernike polynomial:

$$Wa(\rho, \theta) = \sum_j Z_j f_j(\rho, \theta),$$

see, for example, "Optical imaging in projection microlithography", Alfred Kwok-Kit Wong, Tutorial texts in Optical Engineering, Vol. TT66, 2005, SPIE Press, Bellingham, Wash. USA, chapter 7.3.

It is noted that there are multiple definitions of the Zernike polynomials, e.g. normalized and not-normalized, and different numbering schemes. The functioning of an embodiment of the present invention does not depend on a specific definition of the Zernike polynomials.

Aberration data output by the detector DT passes to the processor PR. The processor PR uses this data to form a representation of the distribution of aberrations in the radiation beam. The processor PR then determines the effect of the aberrations upon the pattern projected onto the substrate W. In order to do this, the processor PR is provided with a representation of the pattern of the patterning device MA. This may for example be stored in a storage device such as a memory, which may form part of the processor PR. Once the processor PR has determined the effect of the aberrations upon the pattern projected onto the substrate W, it then calculates an adjustment of the illumination mode which may be used to improve the fidelity of the pattern projected onto the substrate W. In other words, an illumination mode adjustment is calculated such that the projected pattern will be more accurate than the pattern which would have been projected in the absence of the illumination mode adjustment.

Once a desired adjustment of the illumination mode has been determined, this information is passed to the controller CT. The controller CT determines adjustments needed to the orientations of the mirrors, and alters control signals sent to the mirrors of the mirror array accordingly.

The formation of the representation of the distribution of aberrations in the radiation beam, and the determination of the effect of the aberrations upon the pattern projected onto the substrate W are described above as two separate steps. However, the processor PR may perform these as a single step.

Figure 7:
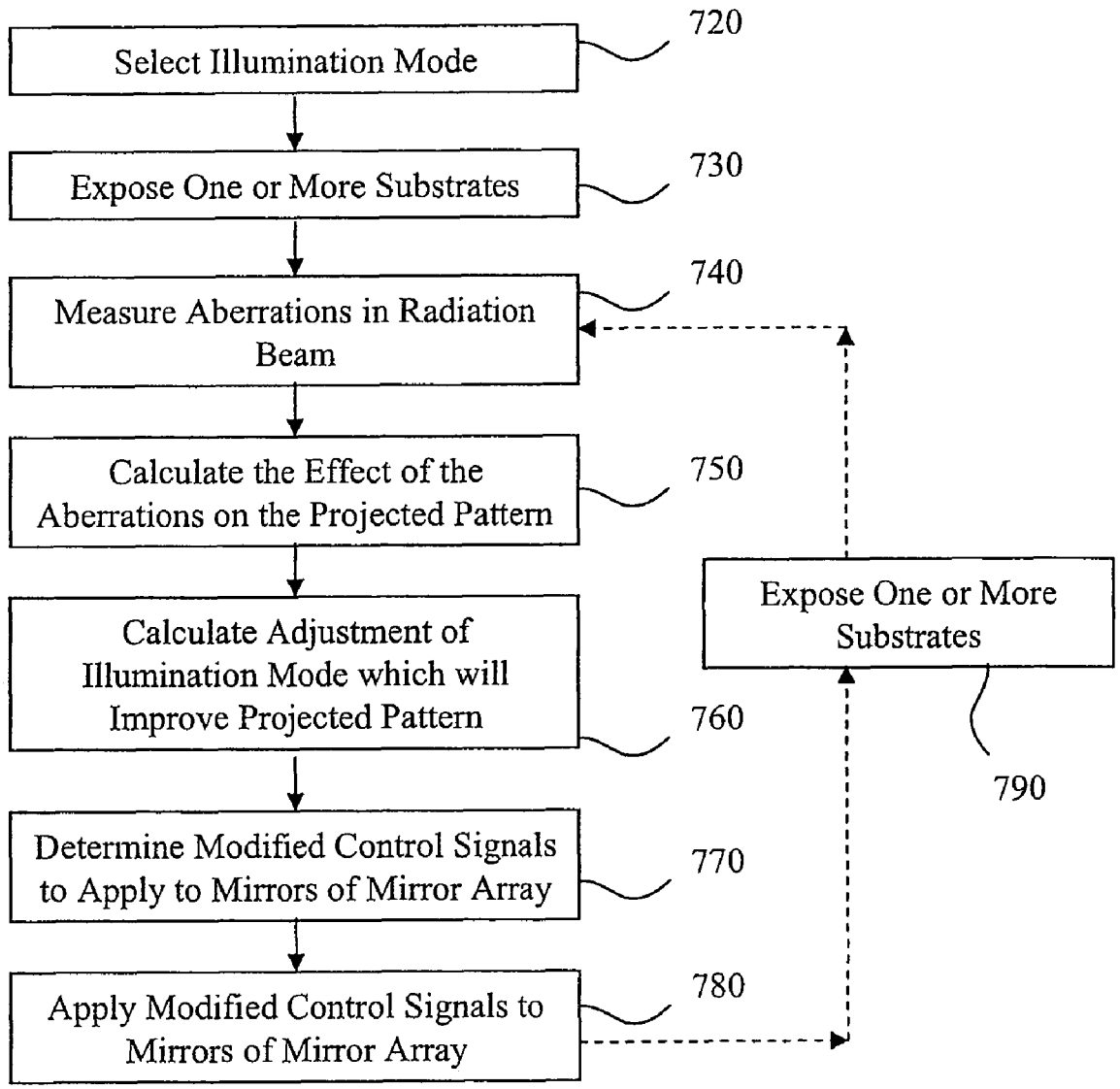
FIG. 7 is a flow chart which shows processes used by an embodiment of the invention.

FIG. 7 is a flow chart which sets out the processes described above. An illumination mode is selected (step 720), the illumination mode being one which is appropriate for the pattern to be projected. The pattern is projected onto one or more substrates (step 730). Aberrations present in the radiation beam are measured (step 740). The effect of the aberrations on the projected pattern is calculated or otherwise determined (step 750). An adjustment of the illumination mode which improves the accuracy of the pattern projected onto the substrate is calculated (step 760). Required modifications of the control signals to be sent to mirrors of the mirror array are determined (step 770), and the modified control signals are applied to the mirrors (step 780).

As explained above, optical elements in the projection system PL will continue to heat up over a considerable period of time. For this reason, the processes set out in FIG. 7 are repeated after a certain time period has elapsed. For example, the processes may be repeated after projection of the pattern or a network of adjacent patterns onto a substrate W has been completed. This is indicated by a dotted line in FIG. 7 which connects the last process step of applying modified control signals to the mirror-array mirrors (step 780) to the process step of exposing a subsequent one or more substrates (step 790) and next to the step 740 of measuring aberrations.

It may be desired to repeat the series of processes shown in FIG. 7 after exposure of each substrate. This may for example continue until the measured aberration is found to be unchanging, indicating that the temperature of the optical elements in the projection system has stabilized.

It may be desired to repeat the series of processes less often, for example after exposure of every second substrate, or of every third substrate, or after some other number of substrates. Since the rate of increase of the temperature decays over time, the time period between repeats of the process series may increase. For example, the process may be performed after exposure of the first substrate, third substrate, sixth substrate, etc.

References to particular processes being performed by particular entities are examples only, and it may be the case that some processes are performed by other entities. Additionally or alternatively, one or more processes may be performed by a single entity. For example, in addition to calculating the adjustment of the illumination mode, the processor PR may also calculate the control signals to be applied to the mirrors.

The adjustments of the illumination mode are not one-step changes between different types of generally known illumination modes, for example between a conventional quadrupole illumination mode and an annular illumination mode. Instead, before and after a single illumination mode adjustment, the type of illumination mode remains substantially the same, and a property of that illumination mode is adjusted. For example, a radial extent of the intensity distribution in the illumination pupil may be stretched in a particular direction, may be made larger, or made smaller.

The processor PR may for example use a program known as LithoGuide, available from ASML, Veldhoven, Netherlands. The LithoGuide software is modeling software which includes a representation of lens heating, and the effect of lens heating upon projected patterns as well as printed patterns.

The effect of lens heating or cooling upon the projected pattern may for example be based upon a model which includes the following equation:

$$B = \sum_i S_i Z_i \qquad (1)$$

where B is an image parameter such as for example the width of a feature. The feature may for example be a trench and B may be a smallest printable, critical dimension. Further, $Z_i$ indicates the Zernike aberration coefficient of different orders i of aberration, and $S_i$ is a measure of sensitivity to the given order i of aberration.

Figure 11:
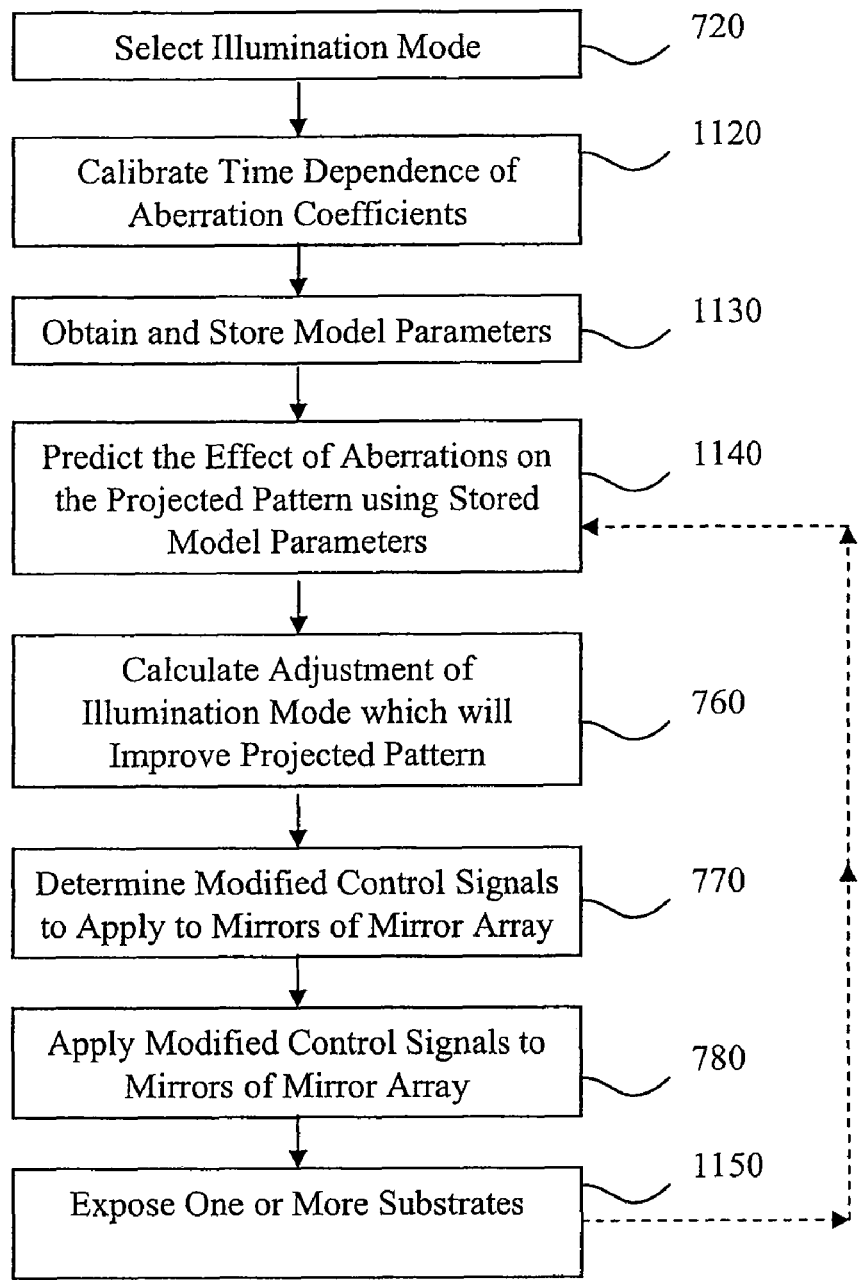
FIG. 11 is a flow chart which shows processes used by an embodiment of the invention including a feed-forward adjustment of illumination mode.

In the above described embodiment of the invention, the desired adjustment of the illumination mode is calculated in real time, i.e. immediately after an aberration measurement has been obtained. In an alternative embodiment of the invention, a flow of process steps includes a calibration exposure run which may be performed in advance, to allow suitable adjustments of the illumination mode to be calculated in advance of a production run. An alternative flow of process steps is illustrated in FIG. 11. After selecting the illumination mode to be used for a production run (step 720) a calibration of the time dependence of aberrations is executed (step 1120). The calibration may involve an exposure run of a batch of substrates comprising, for example, a series of 25 substrates, the aberrations present in the radiation beam being measured using the detector DT in between exposure of two subsequent substrates or after each exposure of a substrate. However, it will be appreciated that a calibration may involve substrate exposure runs comprising less than 25 substrates, depending on the lens heating time constants. For example, with time constants having a value smaller than 15 minutes, a calibration may involve exposure of, for example, just 5 substrates down to just 1 substrate. It will be appreciated that a calibration may also involve a similar determination of time constants and amplitudes characteristic for cooling of optical elements such as may occur, for example, in between two or more exposures or in between exposure of two subsequent substrates. Following the calibration run, the processor PR is used to determine for each measured set of data the effect of the aberrations on the projected pattern, and an appropriate adjustment of the illumination mode to reduce this effect.

The lens-heating induced aberration effect varies dynamically with time, so in order to correct for this lens-heating induced aberration effect, the present embodiment employs the above mentioned model of the effects of lens heating, see Equation (1). Lens heating is accounted for by representing one or more of the Zernike coefficients $Z_i$ as a function of time. For example, the model may represent a Zernike coefficient as a sum of exponential functions, wherein the exponential functions are characterized by respective amplitudes and time constants. Such amplitudes and time constants are examples of parameters that will be referred to hereinafter as model parameters. The calibration measurements are used to compare measured time dependencies of specific aberrations with modelled time dependencies; measuring aberrations at different times as needed for calibrating the time dependencies of aberrations is part of the calibration process step 1120 in FIG. 11. A next process step of obtaining and storing model parameters (step 1130 in FIG. 11) may include a fitting of measured time dependencies of aberrations to respective, modelled time dependencies. Such a fitting yields an estimate for the respective model parameters. These model parameters can be stored as data in a data-storage medium, the data being retrievable by the processor PR.

The obtained model parameters enable a prediction of changes of aberration coefficients $Z_i$ during a subsequent production run of substrate exposures and of the corresponding changes of preselected image parameters B (such as a feature width) over time during the subsequent production run. Such predicting of effects of aberrations is represented by step 1140 in FIG. 11. For example, the processor PR may calculate predictions of changes of image parameters B based on Equation 1, wherein calibrated values of amplitudes and time constants of exponential functions representing Zernike aberrations (as explained above) are retrieved and used for the calculation.

Based on these predictions, feed forward corrections to the intensity distribution representing the illumination mode and needed to compensate for changes of the image fidelity parameter B such as to keep the image parameter B within its respective tolerances during the production run can be calculated and applied (steps 760, 770 and 780, as in the previous embodiment). Next, the production run of one or more substrate exposures can be executed (step 1150), and a feed forward adjustment of the illumination mode can be repeated for a subsequent run of one or more substrate exposures (as illustrated by the dotted arrow in FIG. 11).

Calibration runs may be performed for different illumination modes, and may also be performed for illumination modes of a given type but having different properties. Calibration runs may also be performed for different patterns or different types of pattern.

During a subsequent production run, an appropriate illumination mode is selected for the pattern provided on the patterning device MA. The results of a calibration run which was performed for this illumination mode are retrieved from a memory. These results are used, via the controller CT, to control the orientation of the mirrors of the mirror array in the illuminator IL. This provides adjustment of the illumination mode to reduce the effect of lens heating on the projected pattern. The adjustment is provided without having to measure the aberration of the radiation beam between exposure of substrates, and without having to calculate adjustments between exposures.

In a further embodiment of the invention, the aberration coefficients as a function of time and the corresponding adjustments of the illumination mode may be determined via one or more calibration runs, and saved as a set of data.

During a subsequent production run, the aberration may be measured after exposure of a substrate. The measured aberration may be compared with the set of data to find the most similar stored aberration. The appropriate illumination mode adjustment is then retrieved from the stored data and is applied to the illumination mode.

In general, the embodiment of the invention provides correction of aberration caused by lens heating via adjustment of the illumination mode.

Figure 12:
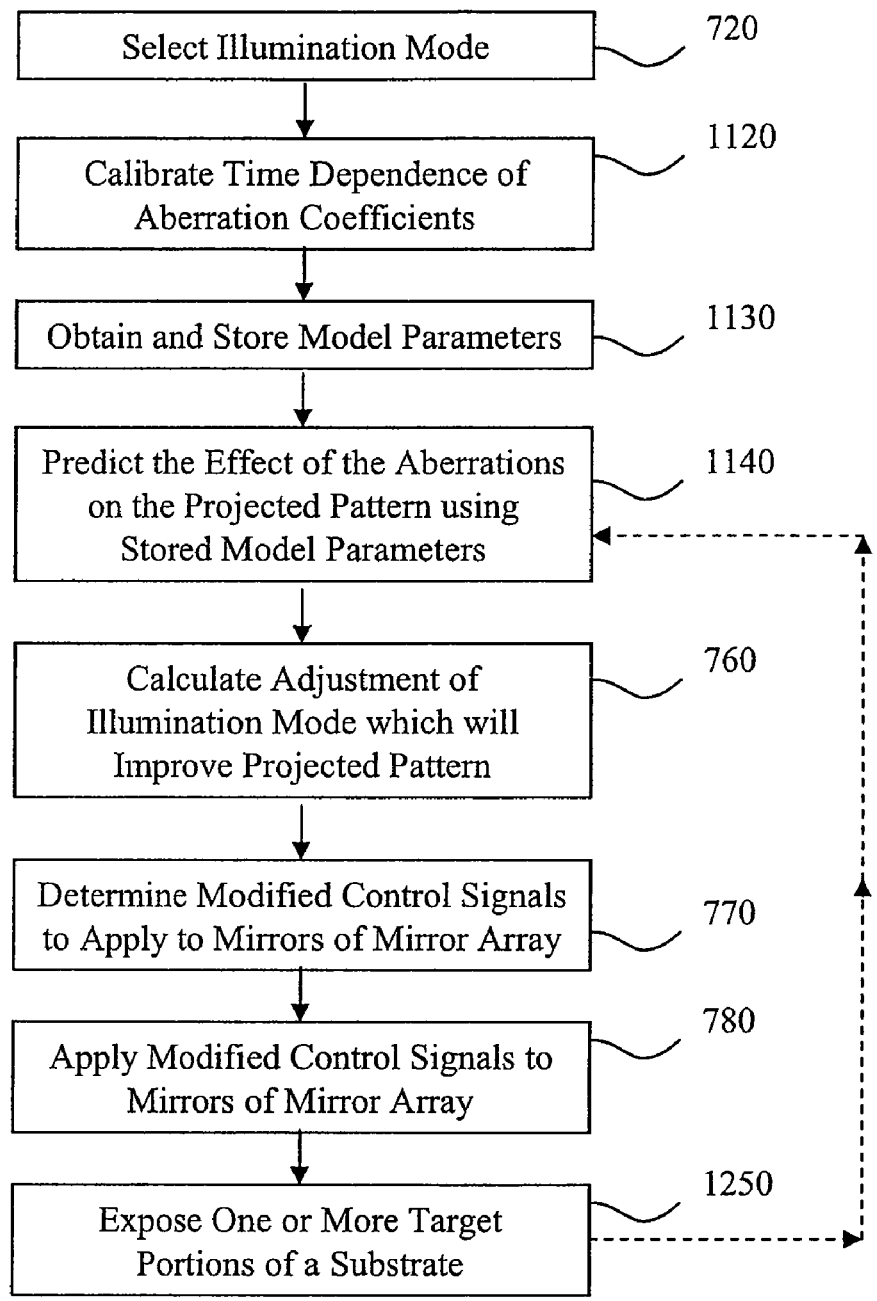
FIG. 12 is a flow chart which shows processes used by an embodiment of the invention including a feed-forward adjustment of illumination mode applied in between exposure of two target portions on a substrate.

A process flow of a further embodiment of the present invention is illustrated in FIG. 12. This process flow is the same as the flow illustrated in FIG. 11 save for the step 1150 in FIG. 11. Whereas in the previous embodiment the feed forward correction is applied after a number of whole substrate exposures (see FIG. 11), in the present embodiment the feed forward correction is applied before (and repeated after) exposing one or more target portions of a single substrate, as illustrated by step 1250 in FIG. 12. With the increased demand for higher throughput in terms of whole substrate exposures per hour, the applied radiation beam intensities have increased to such an extent that lens heating effects on pattern image fidelity may need compensation by illumination mode adjustment in between exposure of two subsequent pluralities of target portions on a single substrate or even between subsequent single target portions.

Figure 8A:
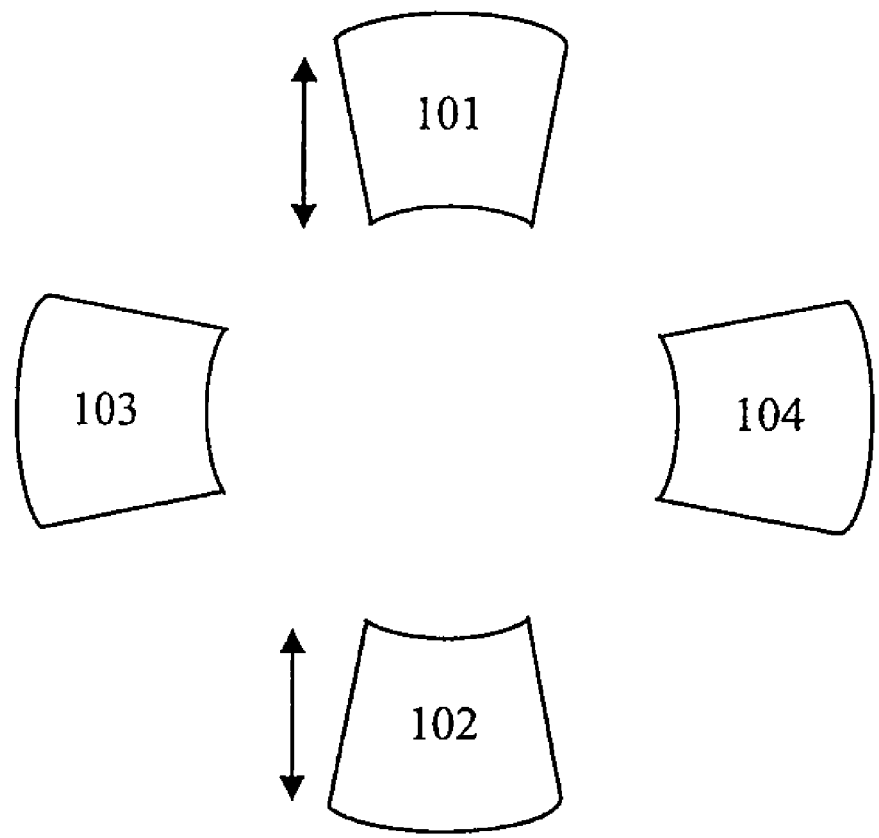
FIG. 8a is a schematic illustration of an illumination mode adjustment which may form part of an embodiment of the invention.
Figure 8B:
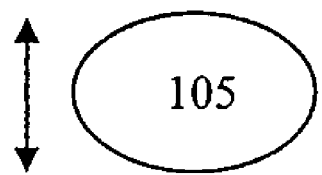
FIG. 8b is an aberrated image of a circular contact hole.

Examples of illumination mode adjustments in accordance with an embodiment of the present invention and of effects of an optical aberration on the projected pattern due to lens heating during projection of the pattern which are to be reduced by the illumination mode adjustments are described below and are illustrative for the embodiments described above. FIGS. 8a and 8b show schematically an adjustment of a quadrupole illumination mode and the effect of that adjustment respectively. The quadrupole illumination mode comprises four poles which for the purposes of this description will be referred to as the upper pole 101, the lower pole 102, left-hand pole 103, and right-hand pole 104. The four poles as drawn in FIG. 8a represent areas of relatively high intensity in a pupil of the illumination system, the plane of the pupil being an X,Y-plane, the poles 103 and 104 being centered with respect to the X-axis, and the poles 101 and 102 being centered with respect to the Y-axis. FIG. 8b shows, viewed from above, a contact hole 105 as it is projected onto a substrate.

In the situation shown in FIGS. 8a and 8b, the contact hole 105 is elliptical (due to aberrations in the radiation beam caused by lens heating), whereas it is intended to be circular. The contact hole 105 therefore needs to be stretched in the direction indicated by the double-headed arrow. This is achieved by modifying the upper and lower poles 101, 102 of the quadrupole illumination mode. The modification comprises stretching the upper and lower poles 101, 102 as indicated by the double-headed arrows in FIG. 8a, for example by increasing the outer radial extent and decreasing the inner radial extent of the poles 101 and 102. The degree to which the poles are to be stretched is determined by the processor PR as described further above. The left and right-hand poles 103, 104 are not modified, and therefore remain the same.

A distortion of the type shown in FIG. 8b may for example arise due to an increase in the amount of astigmatism, as represented by the Zernike aberration coefficient $Z_5$, present in the radiation beam. The adjustment of the illumination mode minimizes or at least reduces the effect of the $Z_5$ aberration.

Figure 9A:
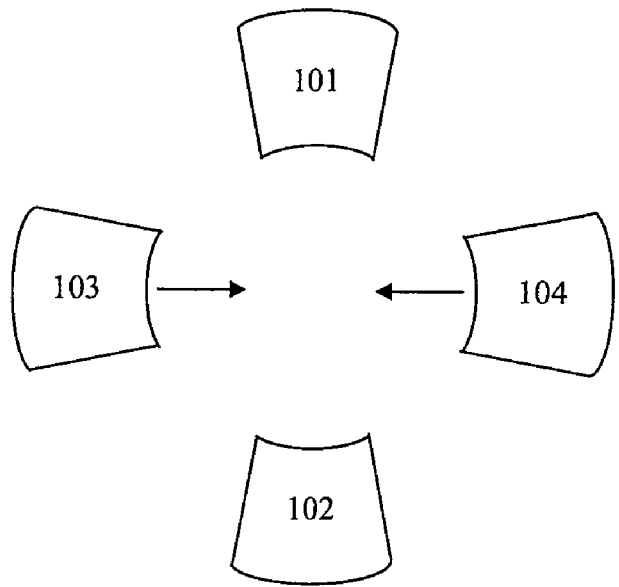
FIG. 9a is a schematic illustration of an illumination mode adjustment which may form part of an embodiment of the invention.
Figure 9B:
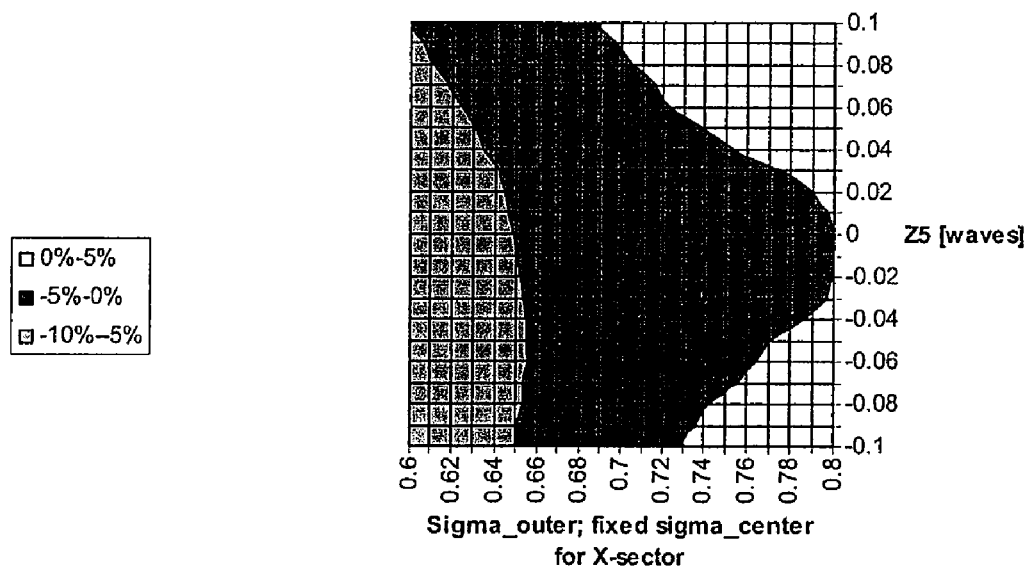
FIG. 9b shows a contour plot of a degree of ellipticity of a contact hole image as a function of wave front aberration and radial extent of the illumination mode.

FIGS. 9a and 9b show schematically a quadrupole illumination mode and a respective plot of the effect of a change of that illumination mode on the shape of the imaged contact hole 105 in FIG. 8b. As shown in FIG. 9a, an adjustment which may be made to the illumination mode comprises moving the left and right-hand poles 103, 104 closer together by decreasing the inner radial extent (decreasing $\sigma_{inner}$) of these poles. At the same time the outer radial extent $\sigma_{outer}$ of these poles is increased such as to keep the center value of the radial extent, defined by $\sigma_{inner}+0.5(\sigma_{outer}-\sigma_{inner})$ constant (in FIG. 9b reference to such a change of illumination mode is made by the text "fixed sigma center for X-sector"). FIG. 9b shows the impact of the $Z_5$ aberration, and illustrates how adjustment of the positions of the left and right-hand poles may be used to minimize or at least reduce the effect of this aberration. A contour plot of the ellipticity of the contact hole 105 is shown. The ellipse shape defines mutually orthogonal short and long axes, and the ellipticity is defined as {1−(size along the short axis/size along long axis)}. Along the horizontal axis of FIG. 9b, there is, plotted the outer radial extent $\sigma_{outer}$ of the poles 103 and 104. Along the vertical axis there is plotted the value of aberration $Z_5$ as a fraction of the wavelength of the radiation beam. In FIG. 9b, it is desirable to be on the transition between the dark grey region and the white region. When no $Z_5$ aberration is present, the desired radial extent $\sigma_{outer}$ of the left and right-hand poles 103, 104 is 0.8 (expressed as a fraction of the numerical aperture). However, once some $Z_5$ aberration is introduced, the desired radial extent $\sigma_{outer}$ of the left and right-hand poles 103, 104 reduces. For example, when $Z_5$ is 0.04, the desired value for $\sigma_{outer}$ is approximately 0.74. The reduction of the distance is achieved by moving together the inner extent of the left and right-hand poles 103, 104 of the illumination mode, as shown schematically by arrows in FIG. 9a.

Figure 10A:
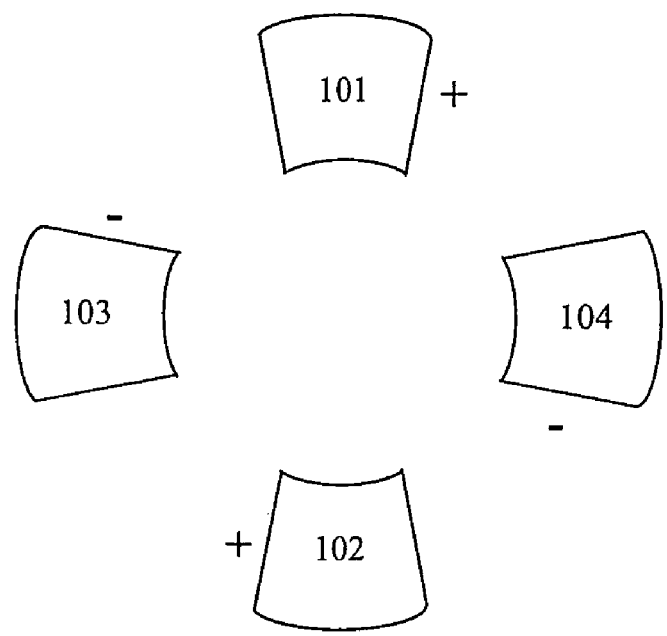
FIG. 10a is a schematic illustration of an illumination mode adjustment which may form part of an embodiment of the invention.
Figure 10B:
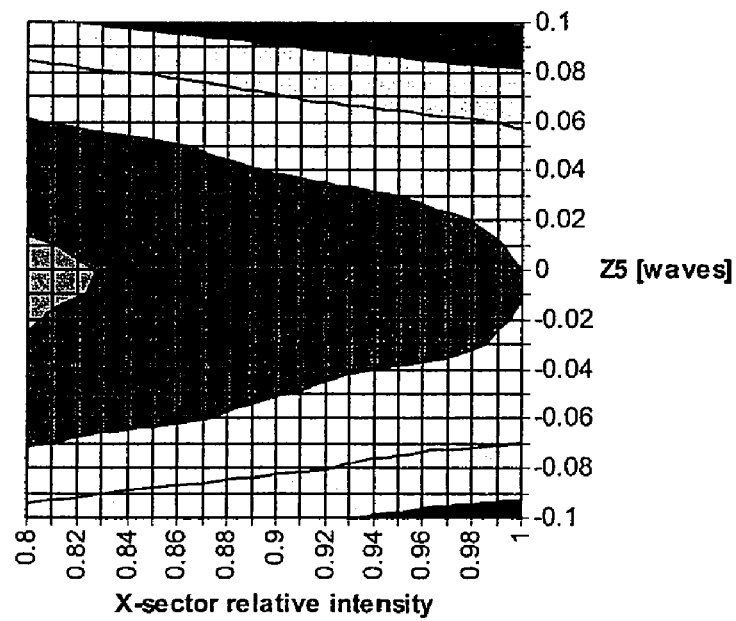
FIG. 10b shows a contour plot of a degree of ellipticity of a contact hole image as a function of wave front aberration and an illumination mode intensity characteristic.

FIGS. 10a and 10b illustrate a further adjustment of the illumination mode which may be used to minimize or at least reduce the effect of a $Z_5$ aberration on the shape of the contact hole 105. FIG. 10b, like FIG. 9b, shows a contour plot of the ellipticity of the contact hole 105. FIG. 10b illustrates effects on the ellipticity of changes of the relative intensity of the so-called X-sector poles (i.e., the left and right-hand poles 103, 104). The relative intensity of the X-sector poles is plotted along the horizontal axis in FIG. 10b. The relative intensity of the X-sector poles is defined as the intensity of these poles normalized by the intensity of the so-called Y-sector poles (i.e., the upper and lower poles 101, 102). Along the vertical axis, in FIG. 10b, there is plotted the value of the aberration $Z_5$ like in FIG. 9b. In common with FIG. 9b, it is desired to stay at the transition between the dark grey region (at the middle of FIG. 9b) and the white region. It can be seen from FIG. 10b that when there is no $Z_5$ aberration present, the ratio of intensities in the X and Y sectors may be 1, i.e. the same amount of energy is present in the left and right-hand poles 103, 104 as is present in the upper and lower poles 101, 102. However, when some $Z_5$ aberration is present in the radiation, an adjustment of the relative intensities in the poles is needed. For example, when $Z_5$=0.04, the relative intensity of the poles 101-104 is adjusted such that the intensity of the X-sector poles (left and right hand poles 103, 104) is approximately a fraction 0.89 of the intensity of the Y-sector poles (upper and lower poles 101, 102).

A further example of an illumination mode adjustment in accordance with the present invention is described below and involves a compensation of a lens heating induced aberration which represents an error of a magnification (or a reduction ratio) along the Y-direction (the scanning direction), of the projection system of a scanning lithographic apparatus. Such an aberration can be described by the Zernike aberration coefficient $Z_3$ wherein for image points (at substrate level) disposed along the Y-direction (the scanning direction) the value of $Z_3$ changes linearly with the Y-coordinate of those image points. On the optical axis of the projection system, in the center of an imaged portion of the pattern, at Y=0, also $Z_3$=0. In view of the linear change of the aberration, this aberration is also referred to as Y-magnification error, or as $Z_3$-tilt aberration or simply as "$Z_3$-tilt". A value of $Z_3$-tilt refers to a maximum value of the corresponding wave front aberration for an image point at the edge of the imaged portion.

A presence of $Z_3$-tilt aberration may in particular affect the fidelity of a printed pattern when the printing process involves a scanning exposure wherein a patterning device pattern comprising both "horizontal" and "vertical" line shaped features is imaged onto the substrate. The horizontal and vertical line-shaped features may hereinafter also be referred to as H- and V-lines, and are aligned with the X- and Y-directions respectively. Resulting horizontal and vertical printed line-shaped features nominally have a same width referred to as the critical dimension or CD. As a result of $Z_3$-tilt aberration a so called H-V difference may be beyond tolerance, where "H-V difference" refers to a difference between the CD of the horizontal lines and a CD of the vertical lines.

A Y-magnification error such as $Z_3$-tilt aberration may typically be introduced in the presence of a quadrupole illumination mode such as illustrated in FIG. 8a. A quadrupole mode wherein 4 poles are disposed in quadrants bisected by the X- and Y-axes may also referred to as a cross quadrupole mode. Such an illumination mode is suitable for use with projecting patterns including both horizontal line-shaped features and vertical line-shaped features. For example, a cross quadrupole illumination mode may be used for printing a pattern including H- and V-lines, both having a line width of critical dimension CD=65 nm. A lithographic printing process for printing such a pattern of lines may, for example, be characterized by a numerical aperture of the projection system being 0.93, the wavelength of the radiation beam being 193 nm, the settings of $\sigma_{inner}$ and $\sigma_{outer}$ being 0.7 and 0.9 respectively, and the setting of a tangential, angular extent (in the X,Y-plane) of the poles 101, 102, 103, and 104 in FIG. 8a being 35 degrees. The latter angular extent refers to the angle (in degrees) subtended by the poles with respect to a point on the optical axis, in the pupil of the illumination system. A pattern to be printed using this process may include regularly spaced, isolated H-lines and similarly regularly spaced, isolated V-lines having nominal line widths of dimension CD=65 nm, where "isolated" refers to the arrays of such regularly spaced lines being arranged at a pitch larger than, for example, 3 CD (195 nm).

In the present embodiment, adjustments of the illumination mode for use to reduce an effect of $Z_3$-tilt may include adjustments of the radial position of the Y-sector poles 101 and 102 which are effectuated by a change of the setting $\sigma_{outer}$ in combination with a same change of setting of $\sigma_{inner}$ of the Y-sector poles 101 and 102. Such a radial position is normalized in the same way as the $\sigma$ values, and is denoted as RPy hereinafter. Adjustments of the illumination mode may further include an adjustment of the angular extent of the Y-sector poles; this angular extent will be denoted by $\phi y$ hereinafter. Adjustments of the illumination mode may further include an adjustment of the relative intensity of the Y-sector poles. This relative intensity is expressed as a fraction RIy of the intensity of the X-sector poles 103 and 104. Another process parameter setting that may be adjusted is the exposure dose, denoted by ED hereinafter. In accordance with an embodiment of the present invention the lithographic printing process may be characterized by sensitivities S expressing a relation between any of these adjustments and corresponding, resulting CD changes. The sensitivities S can be arranged as members of a 4×4 matrix of sensitivities Sij, as listed in Table 1, where the row index i runs from i=1 to i=4, expressing a reference a change of resulting CD (ΔCD) of dense V-lines, isolated V-lines, dense H-lines, and isolated H-lines respectively. In Table 1 the column index j runs from j=1 to j=4, respectively expressing a reference to an adjustment of respectively exposure dose (ΔED), radial position of the Y-sector poles (ΔRPy), relative intensity of the Y-sector poles (ΔRIy), and of the Y-sector pole angle (Δϕy). For example, $S_{23}$ refers to the ratio of a CD change as a result of a corresponding change of RIy divided by that change RIy.

TABLE 1

| ΔCD/ΔED [nm cm²/mJ] | ΔCD/ΔRPy [nm] | ΔCD/ΔRIy [nm] | ΔCD/(0.5 Δϕy) [nm/degree] |
|---|---|---|---|
| $S_{11} = -2.6$ | $S_{12} = 39$ | $S_{13} = -14$ | $S_{14} = 0$ |
| $S_{21} = -2.2$ | $S_{22} = -126$ | $S_{23} = -10$ | $S_{24} = -0.39$ |
| $S_{31} = -2.6$ | $S_{32} = 87$ | $S_{33} = 14$ | $S_{34} = 0$ |
| $S_{41} = -2.2$ | $S_{42} = 49$ | $S_{43} = 10$ | $S_{44} = 0.06$ |

If, due to lens heating, a $Z_3$-tilt of aberration of 16 nm (0.08 waves) is present, a 2 nm H-V error may result: whilst the isolated V-lines remain printed at 65 nm, the isolated H-lines are printed at 63 nm. The magnitude of this heating-induced H-V error is substantially linearly dependent on a heating power associated with the radiation beam, as controlled by, for example, throughput and exposure dose. The H-V error can be compensated by adjusting the radial position of the Y-sector poles as well as the angular extent of the Y-sector poles 101 and 102. With the sensitivities as shown in Table 1 it follows that a combined adjustment of reducing both the settings of $\sigma_{inner}$ and $\sigma_{outer}$ of the Y-sector poles 101 and 102 with −0.03 and increasing the Y-sector pole angular extent from 35 degrees to 55 degrees, a reduction of the 2 nm H-V error can be obtained.

According to a further embodiment of the invention, the effect of an optical aberration due to lens heating may be a change of a CD-pitch characteristic of the printed pattern. The pattern now includes, besides the isolated H-lines and V-lines as described in the previous embodiment, also dense H-lines as well as dense V-lines having a nominal width of CD=65 nm. These dense lines are arranged as regularly spaced lines, where "dense" refers to the arrays of such regularly spaced lines being arranged at a pitch equal to 2 CD (130 nm).

A presence of $Z_3$-tilt may affect the CD of printed lines differently for respective different pitches at which the lines are present in the pattern, and hence differently for the respective dense and isolated H- and V-lines. In the absence of lens heating induced aberrations, the printed lines have the nominal line width of 65 nm, so that as a function of pitch there is (substantially) no variation of CD (beyond tolerance) within the group of horizontal lines (including dense and isolated H-lines), and similarly, within the group of vertical lines (including dense and isolated V-lines). A CD-pitch characteristic refers to at least the printed CD's of two sets of similarly oriented lines arranged at two respective, different pitches, and may for example be a plot of printed CD versus pitch. Like in the previous embodiment, due to lens heating a 2 nm H-V error may be present for the isolated H- and V-lines. However, the $Z_3$-tilt aberration affects the dense H- and V-lines differently (the printed CD of these lines is less sensitive to $Z_3$-tilt). Hence, due to lens heating and in the absence of a reducing of the effect of lens heating, the CD-pitch characteristic for the horizontal lines is different from the CD-pitch characteristic of the vertical lines.

According to an aspect of the invention, like in the previous embodiment, the same adjustments (of the illumination mode, and of exposure dose) can be used to reduce the differences between the aforementioned two different CD-pitch characteristics. For printing the pattern, in the absence of lens heating induced $Z_3$-tilt, a possible set of process parameter settings to use may be exposure dose ED=29 mJ/cm², $\sigma_{inner}=0.7$ and $\sigma_{outer}=0.9$, and the setting of the angular extent of the poles 101, 102, 103, and 104 in FIG. 8a selected at 35 degrees. In the presence of 0.08 waves $Z_3$-tilt, and without applying a reduction of CD-pitch error, the dense and isolated horizontal lines are affected by different amounts of CD change: the width of the isolated horizontal lines is more strongly affected than the width of the dense lines. For example, the width of the isolated H-lines may reduce about 2 nm whereas the width of the dense H-lines may only reduce by a fraction ⅟₆₀ of the isolated H-line width-reduction. Thus, the CD-pitch characteristic of the horizontal lines features an iso-dense error of about 2 nm. The width of the vertical lines remains substantially unchanged, so that there is a difference between the horizontal- and vertical line CD-pitch characteristics. A controller including a computer can be arranged to read from a memory device stored values of sensitivities Sij such as displayed in Table 1, and be programmed to subsequently apply a least square fit method to obtain a set of adjustment settings which, when applied to the lithographic apparatus, reduce such a CD-pitch difference. For example, a change of settings ΔED=1.02 [mJ/cm²], ΔRPy=0.04, ΔRIy=−0.07, and Δϕy=−34 [degrees] results in the isolated H-lines printing at the nominal line width of 65 nm whilst maintaining the printing the widths of the other lines at substantially the nominal size of 65 nm. Hence, a difference between CD-pitch characteristics of respective horizontal and vertical printed lines is reduced. The changes of the Y-sector pole position and the angular extent of the Y-sector poles are contributing most to the reduction. It will be appreciated that an embodiment of the invention is not limited to adjustments mentioned in Table 1. Sensitivities to other illumination mode adjustments such as ring width ($\sigma_{outer}-\sigma_{inner}$) may also be taken into account. According to an aspect of the invention, in the embodiment described above adjustments may be applied to the illumination mode to compensate for effects of cooling in between exposures or in between exposure of subsequent substrates.

As illustrated above, the method of an embodiment of the invention may be used for keeping lens heating induced CD-pitch characteristic changes within tolerance. It is appreciated that an embodiment of the invention is not limited to reducing CD-pitch differences between horizontal and vertical multi-pitch arrangements of pattern features between any one of a) single exposures of a die, b) exposing consecutive pluralities of dies, and c) exposing consecutive substrates. In a production environment, a same lithographic process (such as the process of the present embodiment) may be run on two or more different lithographic projection apparatus. A CD-pitch characteristic of a same pattern printed on different substrates using corresponding different lithographic apparatus may be different, also in the absence of lens heating induced pitch dependent line width changes. Such a difference may be caused, for example, by differences between optical characteristics of the different projection systems (such as different numerical apertures at which the apparatus can operate, or different residual projection system aberrations). A CD-pitch characteristic of the pattern as printed using a first apparatus may be adopted as a reference CD-pitch characteristic. Or, more specifically, a first and second printed CD of mutually parallel lines arranged at a respective first and second pitch may be adopted as a first and second reference line width.

According to an aspect of the present invention, a method described herein may be used for keeping lens heating induced CD-pitch characteristic changes of a same pattern as printed using a second apparatus within tolerance. In particular, the method may be used for predicting and compensating lens heating induced first and second line width changes of a printed pattern, of mutually parallel lines arranged at a respective first and second pitch to reduce a difference between respective printed first and second line widths and respective reference first and second line widths. The compensation includes a compensation of corresponding line widths in the image of the patterning device pattern during exposure.

Other adjustments of the illumination mode which may be used to reduce the effect of lens heating on a projected pattern include changing the shape of the poles (for example tapering the intensity at edges of the poles), moving the inner edge of the poles, moving the outer edge of the poles, and/or oppositely changing the sigma inner and outer settings (i.e. make a radial width of an annular area wider or smaller).

Although the illumination mode adjustments have been described in relation to poles, at least some of the adjustments may be applied to mode types which do not comprise poles. For example, adjustments may be applied to an annular mode, disc mode, or more complicated illumination modes optimized for printing a specific pattern and characterized by a plurality of relatively bright and relatively dark areas in the illumination pupil.

In any of the above described embodiments, the adjustment of an illumination mode involves modifying the illumination mode without substantially changing the illumination mode type. It is not intended to include, for example, a one-step switching between a quadrupole mode with four illumination poles having a substantially equal intensity and an annular mode. Such a switching is disclosed in U.S. Pat. No. 6,658, 084. However, in any of the above described embodiments a substantial modification of the illumination mode relative to the illumination mode used at the start of a production exposure run (or at the start of applying the method according to an embodiment of the present invention) may be effectuated as a result of a cumulative effect of a plurality of illumination mode adjustments over time in accordance with an embodiment of the present invention. For example, initially, in the absence of substantial lens heating, a dipole illumination mode may be the illumination mode in use. Next, after a plurality of exposures, and in the presence of lens heating, an effect of astigmatism due to lens heating may be alleviated by introducing two extra illumination poles in a corresponding quadrupole arrangement. Typically, when such a change of illumination mode is applied, the resulting quadrupole mode is characterized by four illumination poles, the two sets of poles (each set including two opposite poles) having substantially different intensities. Hence, modifications of illumination modes according to an embodiment of the present invention may involve gradual transitions from one illumination mode type to another, different illumination mode type. The adjustment of the illumination mode may be considered to be an adjustment of the angular distribution of the radiation beam.

Although embodiments of the invention have been described above in relation to a mirror array, any other suitable array of individually controllable elements may be used.

The embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

While specific embodiments of the invention have been described above, it will be appreciated that the invention may be practiced otherwise than as described. The description is not intended to limit the invention.

The invention claimed is:

1. A lithographic method, comprising:
providing, using an illumination system comprising an array of individually controllable elements, a beam of radiation having a specific illumination mode;
imparting the beam of radiation with a pattern in the beam's cross-section to provide a patterned radiation beam;
projecting, using a projection system, the patterned radiation beam onto a substrate;
obtaining information on an optical aberration of the patterned beam of radiation traversing the projection system;
comparing a time dependency of the information on the optical aberration to respective modeled time dependencies, wherein the modeled time dependencies are represented by one or more Zernike coefficients and are summed over two or more orders of aberration to determine an image parameter;
estimating respective model parameters based on the comparing;
adjusting, based on the estimated model parameters, the individually controllable elements to control the illumination mode after projecting the pattern onto the substrate, the adjusting being carried out in a manner to reduce an effect of an optical aberration on the projected pattern due to lens heating during projection of the pattern onto a subsequent substrate; and
subsequent to the adjusting, projecting the pattern onto the subsequent substrate.

2. The method of claim 1, wherein the reducing an effect of an optical aberration includes:
determining an effect of the optical aberration on the projected pattern,
determining a change of the illumination mode which at least partially compensates the effect of the optical aberration during projection of the pattern onto the subsequent substrate, and
applying the change to the illumination mode.

3. The method of claim 1, wherein the obtaining information on an optical aberration includes measuring the optical aberration using a detector disposed in a substrate holder constructed and arranged to hold any of the substrates.

4. The method of claim 1, further including adjusting the illumination mode before beginning projection of the patterned radiation beam onto the substrate, wherein the adjusting before beginning projection includes:
using the estimated model parameters for predicting an effect of an optical aberration during the projection of the pattern onto the substrate, and
reducing the predicted effect of the optical aberration on the projected pattern due to lens heating during projection of the pattern onto the substrate.

5. The method of claim 1, wherein the adjusting to control the illumination mode comprises stretching one or more poles of the illumination mode, or changing a separation between one or more poles of the illumination mode, or changing relative intensities of poles of the illumination mode, or changing an inner or outer boundary of the illumination mode, or tapering an intensity of radiation at edges of the illumination mode.

6. The method of claim 1, wherein determining an image parameter comprises determining a width of a smallest printable, critical dimension.

7. A lithographic method, comprising:
providing, using an illumination system comprising an array of individually controllable elements, a beam of radiation having a specific illumination mode;
imparting the beam of radiation with a pattern in the beam's cross-section to provide a patterned radiation beam;
projecting, using a projection system, the patterned radiation beam onto a target portion on a substrate;
obtaining information on an optical aberration of the patterned beam of radiation traversing the projection system;
comparing a time dependency of the information on the optical aberration to respective modeled time dependencies, wherein the modeled time dependencies are represented by one or more Zernike coefficients and are summed over two or more orders of aberration to determine an image parameter;
estimating respective model parameters based on the comparing;
adjusting, based on the estimated model parameters, the individually controllable elements to control the illumination mode after projecting the pattern onto the target portion, the adjusting being carried out in a manner to reduce an effect of an optical aberration on the projected pattern due to lens heating during projection of the pattern onto a subsequent target portion on the substrate; and
subsequent to the adjusting, projecting the pattern onto the subsequent target portion.

8. The method of claim 7, wherein the reducing an effect of an optical aberration includes:
determining an effect of the optical aberration on the projected pattern,
determining a change of the illumination mode which at least partially compensates the effect of the optical aberration during projection of the pattern onto the subsequent target portion, and applying the change to the illumination mode.

9. The method of claim 7, wherein the obtaining information on an optical aberration includes measuring the optical aberration using a detector disposed in a substrate holder constructed and arranged to hold the substrate.

10. The method of claim 7, further including adjusting the illumination mode before beginning projection of the patterned radiation beam onto the target portion, wherein the adjusting before beginning projection includes:
using the estimated model parameters for predicting an effect of an optical aberration during the projection of the pattern onto the target portion, and
reducing the predicted effect of the optical aberration on the projected pattern due to lens heating during projection of the pattern onto the target portion.

11. The method of claim 7, wherein the adjusting to control the illumination mode comprises stretching one or more poles of the illumination mode, or changing a separation between one or more poles of the illumination mode, or changing relative intensities of poles of the illumination mode, or changing an inner or outer boundary of the illumination mode, or tapering an intensity of radiation at edges of the illumination mode.

12. The method of claim 7, wherein determining an image parameter comprises determining a width of a smallest printable, critical dimension.

13. A lithographic apparatus, comprising:
an illumination system comprising an array of individually controllable elements arranged configured to provide a beam of radiation having a specific illumination mode;
a support structure configured to hold a patterning device, the patterning device serving to impart the beam with a pattern in the beam's cross-section to provide a patterned radiation beam;
a substrate table configured to hold a substrate;
a projection system configured to project the patterned radiation beam onto a target portion of the substrate;
a detector arranged to obtain information on an optical aberration of the patterned beam of radiation traversing the projection system;
a processor configured to:
compare a time dependency of the information on the optical aberration to respective modeled time dependencies, wherein the modeled time dependencies are represented by one or more Zernike coefficients and are summed over two or more orders of aberration to determine an image parameter, and
estimate respective model parameters based on the comparing; and
a controller, coupled to the processor, and arranged to control part of the illumination system, the controller being arranged to adjust, based on the estimated model parameters, the individually controllable elements to control the illumination mode of the beam after the beam has been projected onto a substrate or a target portion on a single substrate, the adjustment being carried out in a manner to reduce an effect of optical aberration on the pattern due to lens heating during projection of the pattern onto a subsequent substrate or a subsequent target portion on the single substrate.

14. The apparatus of claim 13, further comprising a memory arranged to store a plurality of illumination mode adjustments linked to a plurality of optical aberration values.

15. The apparatus of claim 13, wherein the controller is arranged to perform at least one of:
stretching one or more poles of the illumination mode;
changing a separation between one or more poles of the illumination mode;
changing relative intensities of poles of the illumination mode;
changing an inner or outer boundary of the illumination mode; or
tapering an intensity of radiation at edges of the illumination mode.

16. The method of claim 13, wherein the image parameter determined by the processor is a width of a smallest printable, critical dimension.

* * * * *